United States Patent [19]
Lusinchi

[11] Patent Number: 6,115,442
[45] Date of Patent: *Sep. 5, 2000

[54] PROGRAMMABLE DIVIDER AND A METHOD FOR DIVIDING THE FREQUENCY OF A PULSE TRAIN

[75] Inventor: Laurent Lusinchi, Saint Egreve, France

[73] Assignee: SGS-Thomson Microelectronics S.A., Gentilly, France

[*] Notice: This patent issued on a continued prosecution application filed under 37 CFR 1.53(d), and is subject to the twenty year patent term provisions of 35 U.S.C. 154(a)(2).

[21] Appl. No.: 08/870,196

[22] Filed: Jun. 6, 1997

[30] Foreign Application Priority Data

Jun. 10, 1996 [FR] France ................................ 96 07385

[51] Int. Cl.[7] ............................................ H03K 21/00
[52] U.S. Cl. .................................. 377/47; 377/48
[58] Field of Search ........................................ 377/47, 48

[56] References Cited

U.S. PATENT DOCUMENTS

| | | | |
|---|---|---|---|
| 3,909,791 | 9/1975 | Van Den Berg | 377/47 |
| 4,193,539 | 3/1980 | Bowman et al. | 235/92 |
| 4,443,887 | 4/1984 | Shiramizu | 377/48 |
| 4,644,195 | 2/1987 | Miller et al. | 307/518 |
| 4,935,944 | 6/1990 | Everett | 377/48 |
| 5,212,716 | 5/1993 | Ferraiolo et al. | 375/119 |
| 5,479,125 | 12/1995 | Tran | 377/47 |
| 5,510,742 | 4/1996 | Lemaire | 327/146 |

OTHER PUBLICATIONS

Patent Abstracts of Japan, vol. 013, No. 201 (E–757), May 12, 1989 & JP–A–01 022106 (Matsushita Electric Ind. Co., Ltd.).

*Primary Examiner*—Margaret R. Wambach
*Attorney, Agent, or Firm*—Wolf, Greenfield & Sacks, P.C.; James H. Morris; Theodore E. Galanthay

[57] ABSTRACT

The present invention relates to a method and a programmable divider of a frequency of a clock signal by an integer by means of a counter, which is programmable by means of n binary signals representing the division ratio, and issuing n binary counting signals of increasing ranks and of decreasing respective frequencies, which consist of performing n−1 logic combinations of the counting signals, and selecting an output signal from among the n−1 logic combinations and n−1 counting signals.

19 Claims, 3 Drawing Sheets

PROGRAMMABLE DIVIDER AND A METHOD FOR DIVIDING THE FREQUENCY OF A PULSE TRAIN

BACKGROUND OF THE INVENTION

1. Field of the Invention

The present invention relates to the implementation of a programmable divider. It more particularly applies to the implementation of a frequency divider which divides a pulse train of a given frequency by an integer number, thereby generating a pulse train, of which the duty ratio or duty cycle is between a third and half a period of the original pulse train. An example of application of the present invention relates to the generation of pulse trains for monitoring infrared-emitting diodes of a remote control.

2. Discussion of the Related Art

A programmable frequency divider is generally implemented based on a programmable asynchronous counter including flip-flops, for example, D flip-flops. The flip-flops generally are mounted in cascade, one output of a flip-flop being connected to one clock input of a next flip-flop. The number of flip-flops correspond to the number of bits over which the counting is performed. A first flip-flop receives, on its clock input, a clock signal, the frequency of which is desired to be divided.

The structure and operation of this type of programmable counter is well known in the prior art and only the features necessary for the understanding of the present invention will be indicated hereafter.

A counter of a programmable divider generally operates as a down-counter, that is, its programming consists of loading each of the flip-flops with a high or low state, the combined respective loading states of the flip-flops representing the binary division ratio. The counter is generally associated with a circuit for detecting the transition through zero of the counter's counting value. This detection is used, in particular, for inducing a cyclic reloading of the binary division ratio.

FIG. 1 shows a first example of a conventional programmable counter.

Such a counter is, for example, a counter CNT 1 having five bits issuing five counting signals DEC0 (rank0), DEC1 (rank1), DEC2 (rank2), DEC3 (rank3), and DEC4 (rank4) corresponding to the respective outputs of the flip-flops (not shown) constitutive of counter 1. A clock input receives a clock signal CLK0, the frequency of which is desired to be divided by an integer i. Number i is programmed by means of five binary signals I0, I1, I2, I3, and I4 sent to the respective inputs of the flip-flops of counter 1. Signal I0 corresponds to the least significant bit. The loading of ratio i is obtained by an edge, for example a rising edge, of a signal LOAD which causes a simultaneous loading of the states of signals I0 to I4. Signal LOAD generally is obtained by a circuit (not shown) for detecting a simultaneous low state on all signals DEC0 to DEC4.

The desired clock signal, the frequency of which corresponds to the frequency of signal CLK0 divided by ratio i, is directly taken from one of the outputs of the counter by selecting one of signals DEC0 to DEC4 which has a rank corresponding to the most significant bit of ratio i.

FIG. 2 illustrates the operation of a counter such as shown in FIG. 1. This drawing shows, in the form of timing diagrams, the shape of signals CLK0, DEC0, DEC1, DEC2, and LOAD when counter 1 is programmed to count to seven.

The respective states of signals I4 to I0 are, in this example, 00111. For each rising edge of signal LOAD, signals DEC0, DEC1, and DEC2 switch to the high state independently of their previous state. Signals DEC3 and DEC4 have not been shown in FIG. 2, they permanently remain in the low state, the most significant bit of ratio (i=7) being carried by signal DEC2.

For each rising edge of signal CLK0, the binary number issued by signals DEC2 to DEC0 is decreased by 1 until a new rising edge of signal LOAD reloads the flip-flops with number 00111.

Signal DEC2 issues a signal having a frequency which is divided by seven with respect to that of signal CLK0.

The direct use of one of the counting signals of such a counter is a particularly simple way of obtaining a frequency division. However, the duty cycle (duration of a pulse for a period) of the clock signal obtained varies considerably according to the division ratio. For example, for a divider over five bits, it is between 6.25% (cyclic ratio of one sixteenth) for a division by sixteen and 66% (cyclic ratio of two thirds) for a division by three.

In some applications, it is necessary that the duty cycle of the signal obtained be maintained in a range of values between 33% and 50%. This is for example the case for infrared remote controls where pulse trains are used to monitor infrared-emitting diodes, and where the duty cycle of the pulses has to be between two standardized values of 33% and 50%.

FIG. 3 shows an example of a conventional programmable divider producing a duty cycle between 33% and 50%, when the division ratio is between two and thirty-two.

Such a divider includes two programmable counters, respectively 2 and 3, which are identical over four bits and are triggered by the same clock signal CLK0, the frequency of which is desired to be divided. Counters 2 and 3 are programmed (by signals I0 to I4 and I'0 to I'4) so that the sum of their respective counting thresholds corresponds to the desired division ratio i. A circuit (not shown) for detecting the counting threshold, by detection of a transition through zero of the counting value, is integrated in each of counters 2 and 3. Here, signals S2 and S3 issued by the respective detection circuits 2 and 3 generate the desired clock signal. Signals S2 and S3 are respectively sent on set and reset inputs of a bistable latch 4, an output S of which issues the desired clock signal. Signal S2 further is sent to load control input LOAD of counter 3 and signal S3 further is sent to load control input LOAD of counter 2.

FIG. 4 illustrates the operation of such a programmable divider. This drawing shows, in the form of timing diagrams, the shapes of signals CLK0, S2, S3 and S for a division ratio of seven. The states of signals I0 to I4 and I'0 to I'4 are, respectively, 0100 and 0011.

At a time t0 where signal S2 switches to the high state, signal S switches to the high state and value 0011 is loaded into counter 3 which then starts to count down to set the duration of the pulse of signal S. At a time t1 when signal S3 switches to the high state, signal S switches to the low sate and value 0100 is loaded into counter 2 which then starts to count down to set the interval between two successive pulses. When signal S2 switches again to the high state (time t2), a new pulse of signal S starts. The switching to the low state of signal S2 or S3 occurs, unless appropriate signals (not shown) for initializing counters 2 and 3 are used, at the latest at the loading of the counting threshold into the counter involved, as is shown in FIG. 4.

Such a divider can generate a duty cycle between 33% (for a division ratio of three) and 50% (for a division ratio of two), but it has the disadvantage of requiring two programmable counters.

SUMMARY OF THE INVENTION

The present invention aims at providing a new method and programmable device for dividing by an integer which only requires one programmable counter and which can generate regardless of the division ratio, a duty cycle between 33% and 50%.

To achieve this object, the present invention provides a method for dividing a frequency of a clock signal by an integer by means of an asynchronous counter, which is programmable by means of n binary signals representing the programmable division ratio, and issuing n binary counting signals of increasing ranks and of decreasing respective frequencies, consisting of performing n−1 logic combinations of the counting signals and selecting an output signal from among the n−1 logic combinations and n−1 counting signals.

According to an embodiment of the present invention, the n−1 counting signals likely to be selected correspond to the signals having the highest ranks.

According to an embodiment of the present invention, each logic combination of a given rank corresponds to the logic AND of the counting signal of the same rank with the logic OR of the inverted j counting signals of lower ranks.

According to an embodiment of the present invention, a logic combination of rank j is selected for a division ratio of $2j+^1-1$, with j included between 1 and n−1.

The present invention also relates to a programmable divider including means for implementing the method according to the present invention.

According to an embodiment of the present invention, said means include a decoding circuit in cabled logic, which receives the n counting signals and issues the n−1 combinations, and a selection circuit, which receives the combinations and n−1 counting signals having the highest ranks and issues a signal having a frequency which corresponds to the frequency of the clock signal divided by the division ratio and the duty ratio of which is between one third and one half.

According to an embodiment of the present invention, the selection circuit constitutes a 2(n−1) to 1 multiplexer, the control of the multiplexer being performed based on the signals for programming the counter and logic combinations of these signals.

According to an embodiment of the present invention, the counter operates as a down-counter from the division ratio, and the programmable divider includes a circuit for detecting the end of the counting.

According to an embodiment of the present invention, the detection circuit includes means for causing a cyclic programming of the counter, the cyclic programming being synchronous with the clock signal.

BRIEF DESCRIPTION OF THE DRAWINGS

The foregoing and other objects, characteristics and advantages of the present invention will be discussed in detail in the following non-limiting description of a specific embodiment of the present invention, taken in conjunction with the accompanying drawings, among which.

DETAILED DESCRIPTION

Figure 1:
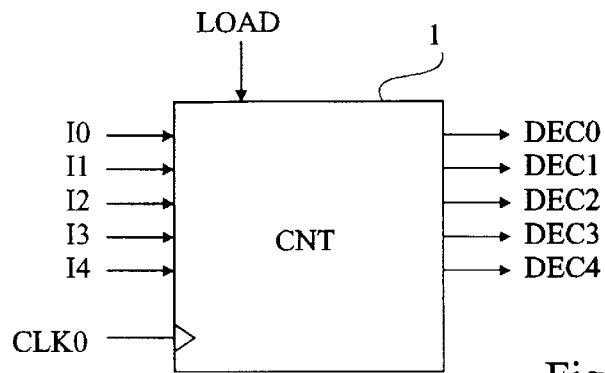
FIG. 1 is a block diagram of one embodiment of a conventional counter of a programmable divider.
Figure 2:
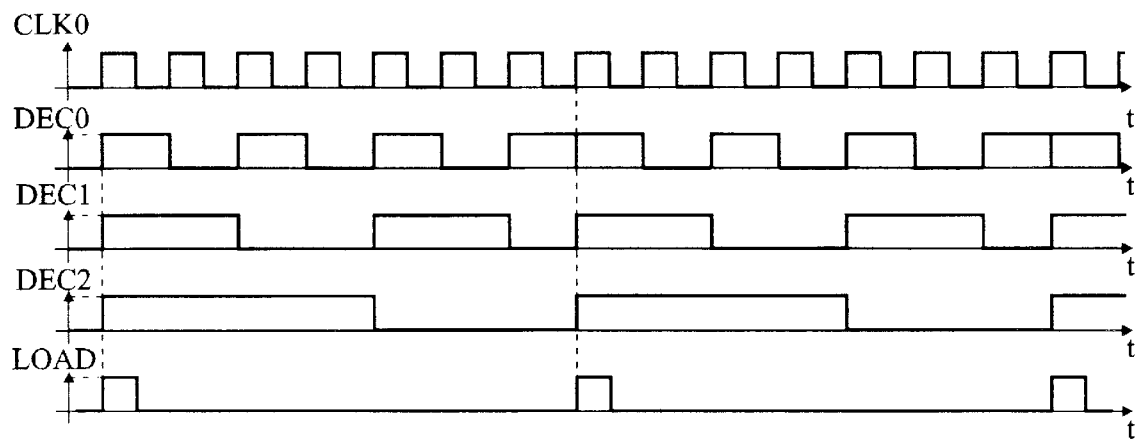
FIG. 2 is a series of timing diagrams of a conventional counter of a programmable divider shown in FIG. 1.
Figure 3:
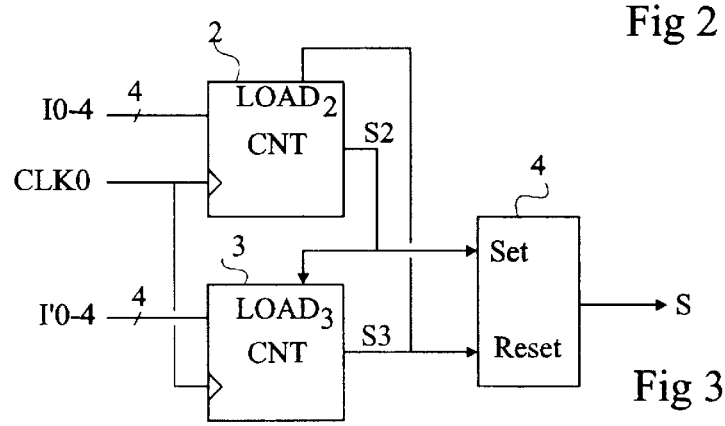
FIG. 3 is a block diagram of one embodiment of a programmable divider.
Figure 4:
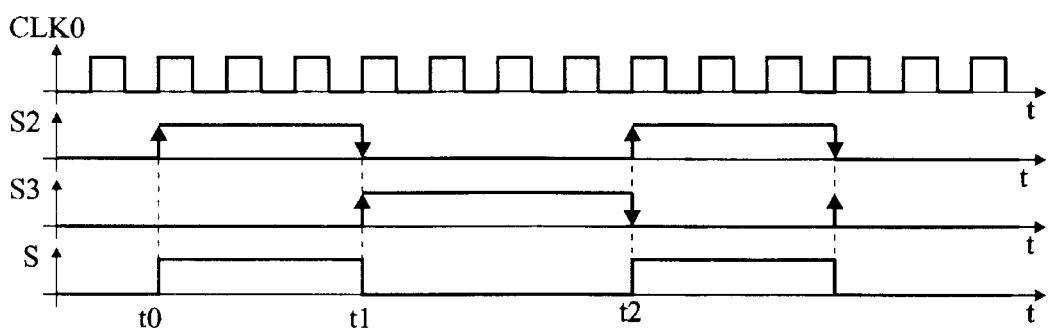
FIG. 4 is a series of timing diagrams of a programmable divider shown in FIG. 3.

For clarity, the same components have been referred to by the same references in the different drawings. Only the components of the programmable divider which are necessary for the understanding of the present invention have been shown in the drawings and will be described hereafter.

Figure 5:
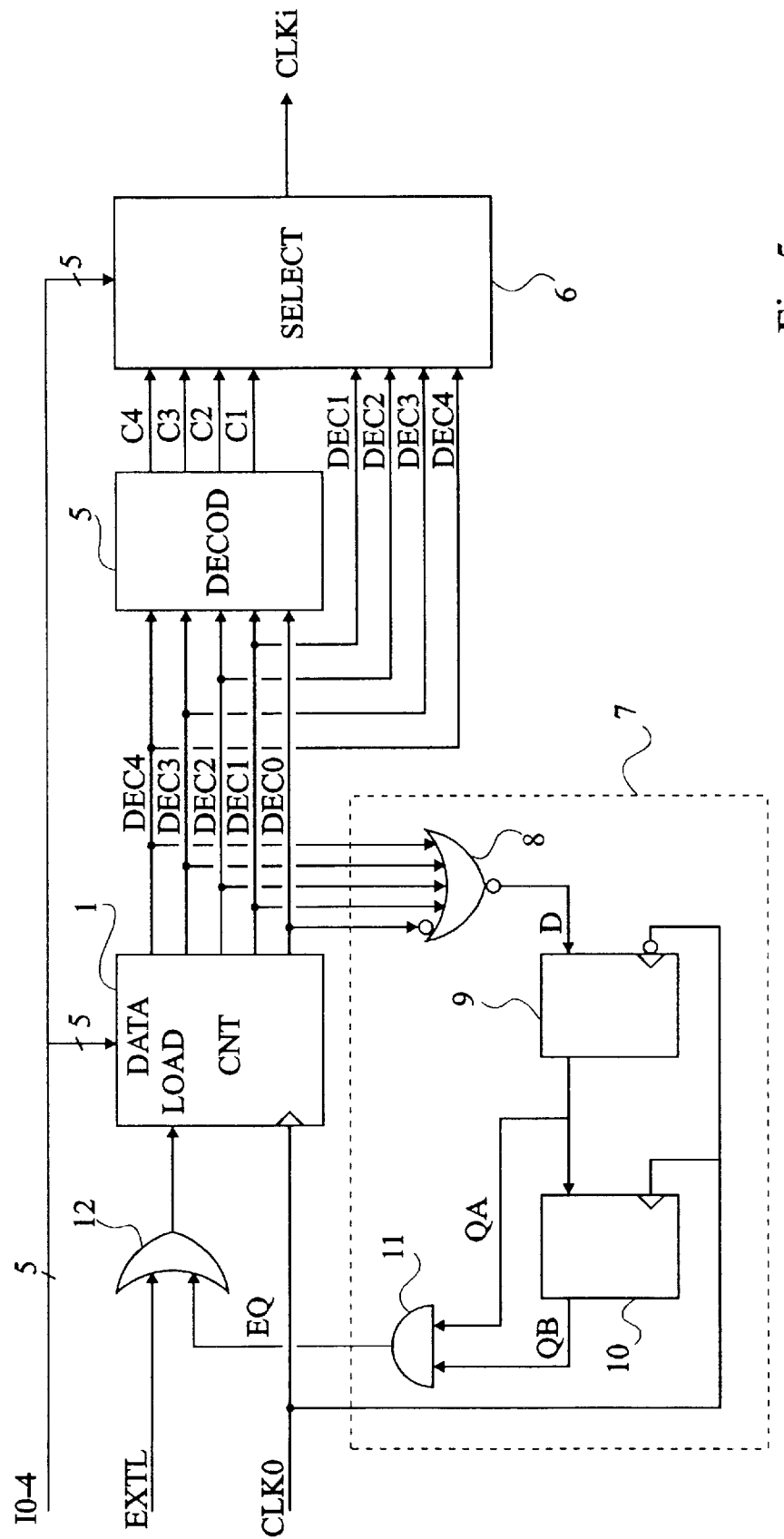
FIG. 5 is a block diagram of one embodiment of a programmable divider according to the present invention.

FIG. 5 shows an embodiment of a programmable divider according to the present invention. It is, for example, a divider by an integer between two and thirty-two.

The divider includes an asynchronous programmable counter 1 over n bits (here, n=5), similar to the counter shown in FIG. 1 and operating as a down-counter. The counting threshold of counter 1, corresponding to the desired division ratio i, is programmed by means of five binary signals I0 to I4 sent onto data inputs DATA of counter 1. Counter 1 issues n binary counting signals DEC0, DEC1, DEC2, DEC3, and DEC4 having increasing ranks and decreasing respective frequencies, corresponding to the output signals of flip-flops (not shown) which constitute counter 1. The frequency of a given counting signal is twice (or a multiple of 2 if some flip-flop outputs are not used) the frequency of the higher rank counting signal.

According to the present invention, counter 1 is associated with a decoding circuit 5, performing logic combinations of signals DEC0, DEC1, DEC2, DEC3, and DEC4. In the example shown, circuit DECOD 5 issues four logic signals C1, C2, C3, and C4.

According to the invention, the divider also includes a selection circuit 6 receiving as inputs, in addition to signals C1 to C4, signals DEC1 to DEC4 which are the n−1 down-counting signals with the highest ranks. Circuit SELECT 6 has the function of selecting one of the signals that it receives according to division ratio i, and issue this signal as an output clock signal CLKi of the divider.

According to the present invention, the counter 1 is an asynchronous counter to allow using different frequency counting signals. A conventional synchronous counter on the other hand gives counting signals with different phases but at a same frequency.

A characteristic of the present invention is that all possible signals CLKi ($2 \leq i \leq 32$) are obtained from n−1 signals DECj and n−1 logic combinations Cj performed by circuit 5, that is, 2(n−1) signals, while providing a duty cycle between 33% and 50%.

Circuit 6 receives signals I0 to I4 to be able to determine the ratio i based on which it performs the selection. Circuit 6, for example, is an eight to one (2(n−1)) multiplexer controlled by signals Ij and logic combinations thereof.

According to the present invention, the logic combinations performed by circuit 5 are as follows:

$$Cj = DEC_j \cdot \sum_{k=0}^{j-1} \overline{DEC_k}, \text{ for } j \text{ between 1 and } n-1$$

According to the present ivnention, circuit 6 selects, for example, the following signals for generating a signal CLKi:

C1 for i=3,
C2 for i=7,
C3 for i=15,
C4 for i=31,
that is, Cj for $2^{j+1}-1$ with j between 1 and n−1;
DEC1 for i=2, 4 and 5; and
DEC2 for i=6 and 8 to 11,
DEC3 for i=12 to 14 and 16 to 23,
DEC4 for i=24 to 30 and 32,
that is, DECj for $2^{j+1}-2^{j}-1 \leq i < 2^{j+1}+2j$ and $i \neq 2^{j+1}-1$, with j between 2 and n−1.

The practical implementation of the selection circuit is within the abilities of those skilled in the art based on the functional indications given here above. It should be noted that the above-indicated selections, which make the combination of signals I0 to I4 particularly simple for performing the selection, can be altered according to the implementation of the selection circuit, in particular, according to the control logic of an eight to one multiplexer, or to control logic of several two to one multiplexers associated appropriately for constituting the eight to one multiplexer.

Thus, the selection ranges of signals DECj for j between 1 and n−1 can, for example, become:

$$2^{j+1}-2^{j-1}-1 \leq I < 2^{j+1}+2^{j} \text{ and } i \neq 2^{j+1}-1$$

with the selection ranks of combinations Cj remaining unchanged.

Circuit 6 generally has, at its output, a flip-flop (not shown) for synchronizing signal CLKi on signal CLK0 to avoid the occurrence of disturbances linked with the switchings performed in circuit 6.

It should be noted that a specific logic combination of signals I0 to I4, for example $\overline{I0.I1.I2.I3.I4}$ can be used to issue a signal CLK1 (division ratio of 1), that is, signal CLK0. For example, an output multiplexer (not shown) selects signal CLK0 instead of the output signal of the synchronization flip-flop.

It should also be noted that a specific logic combination can be used to select signal C(n−1) when all bits I0 to In−1 are at state 0 in order to issue a signal CLK($2^n$). FIG. 5 also illustrates a preferred embodiment of a circuit 7 for detecting the end of a counting cycle.

This circuit 7 includes a logic gate 8 performing a NOR combination and receiving as inputs, respectively, inverted signal DEC0 and signals DEC1 to DEC4. An output of gate 8 issues a signal D which is in the high state only when the sole signal DEC0 is in the high state, that is, when the counter reaches value 1. Signal D is sent onto an input of a first flip-flop 9. An output QA of flip-flop 9 is sent onto an input of a second flip-flop 10, and output of which is combined in an AND gate 11 with output QA. An output EQ of gate 9 constitutes a loading signal issued, via an OR gate 12, to a loading control input LOAD of counter 1. Gate 12 receives, on a second input, an external signal EXTL enabling to reset the divider.

Flip-flops 9 and 10 are respectively triggered by the falling and rising edges of signal CLK0. Thus, and as will be seen hereafter in relation with FIG. 6, the reloading of ratio i into counter 1 is synchronous with a rising edge of signal CLK0. This enables avoiding any delay and any disturbance of signals DEC0 to DEC4 at the beginning of a new counting cycle and to ensure that the output signals of the counter are synchronous with clock signal CLK0.

Figure 6:
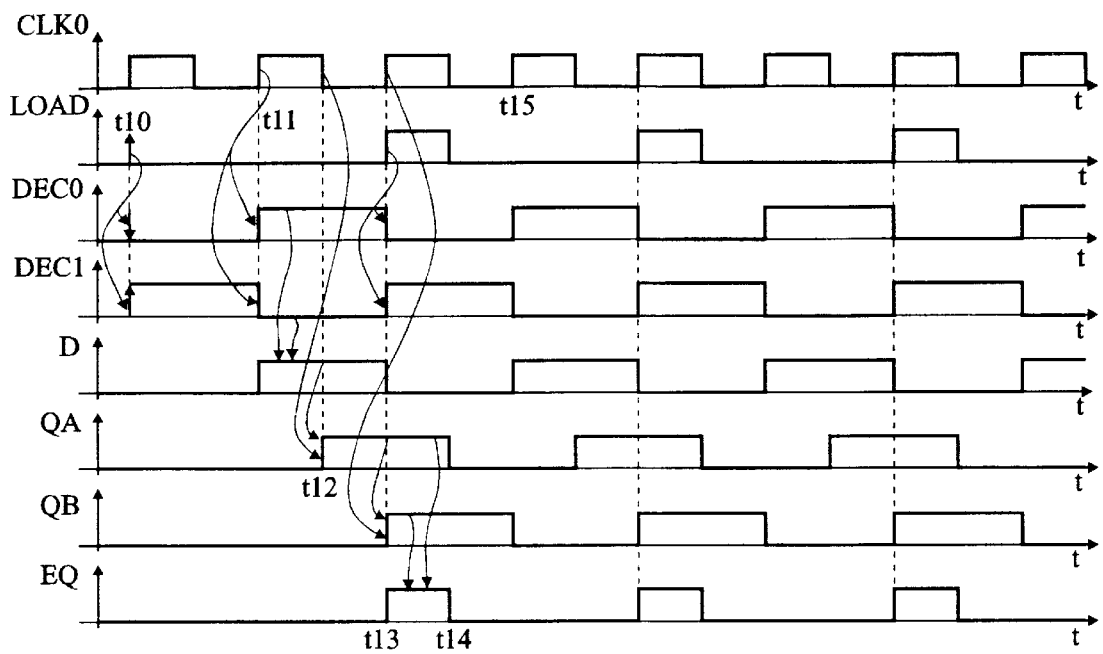
FIGS. 6 to 8 show a series of timing diagrams, obtained by means of a programmable divider as shown in FIG. 5.

FIG. 6 illustrates the operation of a programmable divider such as shown in FIG. 5 for a division ratio of two. This drawing shows the shape of signals CLK0, LOAD, DEC0, DEC1, D, QA, QB and EQ.

It is assumed that at a time t10, the input LOAD of counter 1 receives a loading command carried by signal EXTL (not shown in FIG. 6). This command appears as a pulse having a duration lower than one period of signal CLK0 and is, for example, generated by a microprocessor to which the programmable divider is associated. The occurrence of a rising edge of signal LOAD results in the loading of the flip-flops of counter 1 with the states present on signals I0 and I1, respectively 0 and 1. These states are transferred at the same time on signals DEC0 and DEC1.

At a time t11 corresponding to the following rising edge of signal CLK0, signal DEC0 switches to state 1 and signal DEC1 switches to state 0. Since signals DEC2, DEC3, and DEC4 (not shown) are permanently in state 0 for a division ratio of two, signal D switches to state 1 at time t11.

At the following falling edge of signal CLK0 (time t12), signal QA switches to state 1 and, at the following rising edge of signal CLK0 (time t13), signal QB switches to state 1.

Signal EQ thus switches to state 1 at time t13. Its rising edge causes a new loading, synchronous with the rising edge of clock CLK0, of the states of signals I0 and I1 in the flip-flops of counter 1. Signal D then switches back to state 0. Thus, signal QA switches back to state 0 at the following falling edge (time t14) of signal CLK0, which causes the disappearing of the pulse generated by circuit 7 on input LOAD of counter 1. The counter then is ready for down-counting again when the following rising edge (time t15) of CLK0 occurs.

Signal CLK2 having a frequency divided by two with respect to the frequency of signal CLK0 is comprised, preferably, of signal DEC1 although it can also be comprised of signal DEC0. This enables limiting the size of the required multiplexer, and signal DEC0 then is not used by circuit 6. The duty cycle obtained for a division by two is 50%.

Figure 7:
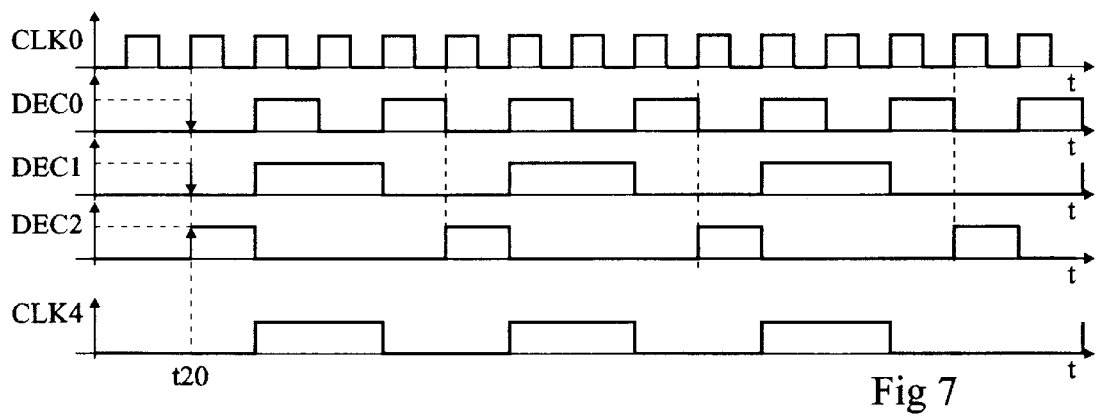
Figure 8:
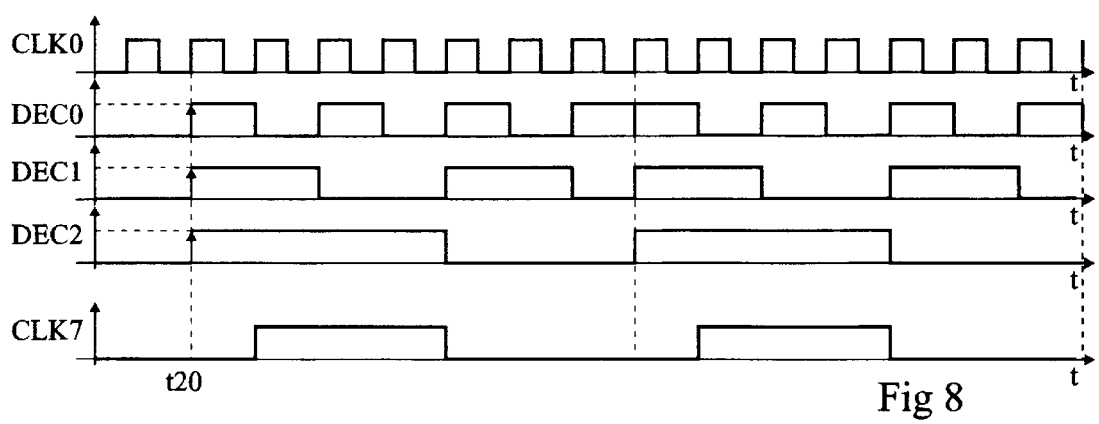

FIGS. 7 and 8 illustrate the operation of the programmable divider such as shown in FIG. 5 for respective division ratios of four and seven. These drawings show the shapes of signals CLK0, DEC0, DEC1, DEC2, and CLK4 and CLK7, respectively.

An initial loading caused by a pulse of signal EXTL occurs at a time t20.

For a division by four, signal CLK4 corresponds, according to the invention, to signal DEC1. The duty cycle obtained is 50%, whereas it is 25% by means of a conventional divider such as described in relation with FIG. 1.

For a division by seven, signal CLK7 corresponds to signal C2 (DEC2(DEC1+DEC0)). The duty cycle obtained is 42%, whereas it is 57% by means of a conventional divider such as described in relation with FIG. 1.

The signal selected by circuit 6 for the other division ratios can be inferred from the above-indicated relations. The duty cycle obtained is always between 33% (for i=3) and 50% (for i=2, 4, 6, 8, 14, 16, and 30). In particular, the duty cycle is 46% for i=15 and 48% for i=31. The duty cycle have been indicated as integers without their fractional parts, and the duty cycle of 50%, which is within the upper limit.

An advantage of the present invention is that it requires only one programmable counter.

Another advantage of the present invention is that the association of circuits 5 and 6 enables to minimize the number of signals used as output signals. Thus, the logic, preferably a cabled logic, of circuits 5 and 6 is particularly simple and compact. Of course, the present invention is likely to have various alterations, modifications, and improvements which will readily occur to those skilled in the art. In particular, the practical implementation of decoding circuit 5 and selection circuit 6 are within the abilities of those skilled in the art based on the function indications given hereabove.

Such alterations, modifications, and improvements are intended to be part of this disclosure, and are intended to be within the spirit and scope of the present invention. Accordingly, the foregoing description is by way of example only and is not intended to be limiting. The present invention is limited only as defined in the following claims and the equivalents thereto

What is claimed is:

1. A method of dividing a frequency of a clock signal by a programmable division ratio I, comprising the steps of:
    programming an asynchronous counter with n binary signals representing the division ratio;
    issuing from the counter n counting signals of increasing ranks having decreasing frequencies respectively;
    generating n−1 logic combination signals of the n counting signals, the logic combination signals having ranks corresponding to the ranks of n−1 highest ranking counting signals; and
    selecting, by the n binary signals, an output signal from among the n−1 logic combination signals and n−1 counting signals.

2. A method according to claim 1, wherein the ranks of the n−1 counting signals are the n−1 highest ranking counting signals.

3. A method of dividing a frequency of a clock signal by a programmable division ratio i, comprising the steps of:
    programmable an asynchronous counter with n binary signals representing the division ratio;
    issuing from the counter n counting signals of increasing ranks having decreasing frequencies respectively;
    generating n−1 logic combination signals of the n counting signals, the logic combination signals having ranks corresponding to the ranks of n−1 highest ranking counting signals; and
    selecting, by the n binary signals, an output signal from among the n−1 logic combination signals and n−1 counting signals;
    wherein each logic combination signal C of a given rank j is related to each counting signal DEC of given rank j by a formula $$C_j = DEC_j \cdot \sum_{k=0}^{j-1} \overline{DEC_k}, \text{ for } j \text{ between 1 and } n-1.$$

4. A method according to claim 3, wherein the output signal is a logic combination of a rank j between 1 and n−1, when the division ratio is $2^{j+1}-1$.

5. A programmable divider comprising:
    an asynchronous counter having inputs for receiving n binary signals representing a division ratio;
    said asynchronous counter having outputs issuing n counting signals of increasing rank having decreasing frequencies, respectively;
    a decoding circuit generating n−1 logic combination signals of the n counting signals, the logic combination signals having ranks corresponding to the ranks of n−1 highest ranking counting signals; and
    a selection circuit for selecting, by the n binary signals, an output signal from among the n−1 logic combination signals and n−1 counting signals.

6. A programmable divider according to claim 5, wherein:
    the decoding circuit receives the n counting signals and issues the n−1 logic combination signals; and
    the selection circuit, n−1 receives the logic combination signals and n−1 counting signals having the highest ranks and issues the output signal having a frequency which corresponds to the frequency of the clock signal divided by the division ratio where the output signal has a duty ratio between one third and one half.

7. A programmable divider according to claim 6, wherein the selection circuit has a 2(n−1) to 1 multiplexer, the control of the multiplexer is performed by the n binary signals.

8. A programmable divider according to claim 5, wherein the counter operates as a down-counter, counting down from the division ratio, the counter includes a detection circuit for detecting an end of the counting.

9. A programmable divider according to claim 8, wherein the detection circuit includes means for cyclically programming the counter, the cyclic programming being synchronous with the clock signal.

10. A programmable divider according to claim 9, wherein the means for cyclically programming the counter comprise:
    a NOR logic gate receiving the n−1 counting signals having the highest ranks and the inverse of the counting signal of the least significant rank;
    a first flip-flop having an input receiving an output of the NOR logic gate, the first flip-flop being triggered by an inverse of the clock signal;
    a second flip-flop having an input receiving an output of the first flip-flop, the second flip-flop being triggered by the clock signal;
    an AND logic gate receiving an output of the second flip-flop and the output of the first flip-flop; and
    an OR logic gate receiving the output of the AND logic gate and an input from a control signal, wherein the counter is loaded with the n binary signals when either the control signal is active or the output of the AND logic gate is active.

11. A programmable divider for dividing a frequency of a clock signal by a division ratio n, comprising:
    programmable counting means for receiving n binary signals representing the division ratio and counting from the division ratio and for outputting n counting signals of increasing ranks having decreasing frequencies respectively;
    logic combination generating means for generating n−1 logic combination signals of the n counting signals, the logic combination signals having ranks corresponding to the ranks of n−1 highest ranking counting signals; and
    selecting means for selecting an output signal from among the n−1 logic combination signals and n−1 highest ranking counting signals.

12. A programmable divider as in claim 11, wherein the programmable counting means comprises an asynchronous counter being triggered by the clock signal, having a first input for receiving the n binary signals and having a second input for receiving a control signal.

13. A programmable divider as in claim 12, wherein the control signal is generated by means for cyclically programming the counter, the cyclically programming means comprise:
    a NOR logic gate receiving the n−1 counting signals of the most significant ranks and the inverse of the counting signal having the least significant rank;

a first flip-flop having an input receiving an output of the NOR logic gate, the first flip-flop being triggered by an inverse of the clock signal;

a second flip-flop having an input receiving an output of the first flip-flop, the second flip-flop being triggered by the clock signal;

an AND logic gate receiving an output of the second flip-flop and the output of the first flip-flop; and an OR logic gate receiving the output of the AND logic gate and an external signal, the OR logic gate issuing the control signal, wherein the counter is loaded with the n binary signals when the control signal is active.

14. A programmable divider as in claim 11, wherein the counter is a down-counter, counting down from the division ratio.

15. A programmable divider for dividing a frequency of a clock signal by a division ratio n, comprising:

programmable counting means for receiving n binary signals representing the division ratio and counting from the division ratio and for outputting n counting signals of increasing ranks having decreasing frequencies respectively;

logic combination generating means for generating n−1 logic combination signals of the n counting signals, the logic combination signals having ranks corresponding to the ranks of n−1 highest ranking counting signals; and selecting means for selecting an output signal from among the n−1 logic combination signals and n−1 highest ranking counting signals;

wherein the selecting means selects one of the n−1 highest ranking logic combination signals when the rank of the logic combination signal is related to the division ratio i by the formula $i=2^{j+1}-1$.

16. A programmable divider as in claim 15, wherein the selecting means selects a counting signal having a rank j between 2 and n−1, when the rank j of the counting signal is related to the division ratio i by the formula $2^{j+1}-2^{j-1} \leq i \leq 2^{j+1}+2^j$, where $i \neq 2^{j+1}-1$.

17. A programmable divider for dividing a frequency of a clock signal by a division ratio n, comprising:

programmable counting means for receiving n binary signals representing the division ratio and counting from the division ratio and for outputting n counting signals of increasing ranks having decreasing frequencies respectively;

logic combination generating means for generating n−1 logic combination signals of the n counting signals, the logic combination signals having ranks corresponding to the ranks of n−1 highest ranking counting signals; and selecting means for selecting an output signal from among the n−1 logic combination signals and n−1 highest ranking counting signals;

wherein the logic combination generating means comprises a decoder generating the logic combination signals, wherein each logic combination signal of a given rank j is equal to a product of a counting signal of the given rank j and the sum of the complement of each counting signal having a rank between 0 and j−1, wherein j is between 1 and n−1.

18. A programmable divider for dividing a frequency of a clock signal by a division ratio n, comprising:

programmable counting means for receiving n binary signals representing division ratio and counting from the division ratio and for outputting n counting signals of increasing ranks having decreasing frequencies respectively;

logic combination generating means for generating n−1 combination signals of the n counting signals, the logic combination signals having ranks corresponding to the ranks of n−1 highest ranking counting signals; and selecting means for selecting an output signal from among the n−1 logic combination signals and n−1 highest ranking counting signals;

wherein the duty cycle is between 33% and 50%.

19. A programmable divider as in claim 18, requiring only one counter.

* * * * *